United States Patent [19]

Johannsmeier et al.

[11] 4,443,096
[45] Apr. 17, 1984

[54] ON MACHINE RETICLE INSPECTION DEVICE

[75] Inventors: Karl-Heinz Johannsmeier, Los Altos; Edward H. Phillips, Middletown, both of Calif.

[73] Assignee: Optimetrix Corporation, Mountain View, Calif.

[21] Appl. No.: 264,410

[22] Filed: May 18, 1981

[51] Int. Cl.³ .............................................. G03B 27/42
[52] U.S. Cl. ...................................... 355/53; 356/390; 356/394
[58] Field of Search ........................... 355/43, 53, 68; 356/390, 394

[56] References Cited

U.S. PATENT DOCUMENTS

| | | | |
|---|---|---|---|
| 3,170,367 | 2/1965 | Wick | 355/68 |
| 3,422,442 | 1/1969 | Glendinning et al. | 355/68 |
| 3,458,262 | 7/1969 | Greenlee | 355/68 |
| 3,476,476 | 11/1969 | Chitayat | 355/53 |
| 3,494,695 | 2/1970 | Sollima et al. | 355/53 |
| 3,497,705 | 2/1970 | Adler | 355/53 |
| 3,506,352 | 4/1970 | Denner | 355/68 |
| 4,008,967 | 2/1977 | Kiemle | 356/239 |
| 4,148,065 | 4/1979 | Nakagawa et al. | 358/101 |
| 4,202,631 | 5/1980 | Uchiyama et al. | 356/394 |
| 4,247,203 | 1/1981 | Levy et al. | 356/390 |

FOREIGN PATENT DOCUMENTS 17759 10/1980 European Pat. Off. .
2052090 1/1981 United Kingdom .

OTHER PUBLICATIONS

Solid State Technology, vol. 23, No. 6, Jun. 1980, pp. 80–84, S. Wittkeok: "Step-and-Repeat Wafer Imaging".

Elektronik, vol. 27, No. 11, Oct. 1978, pp. 59–66, H. Schaumburg: "Neue Lithografieverfahren in der Halbleitertechnik".

Solid State Technology, vol. 23, No. 8, Aug. 1980, p. 92, "The Unique Fully Automatic Direct Wafer Steppers From Optimetrix Are Now In Production".

Primary Examiner—Monroe H. Hayes
Attorney, Agent, or Firm—Roland I. Griffin; Patrick J. Barrett

[57] ABSTRACT

A device is disclosed for use on a projection type semiconductive wafer precision step-and-repeat alignment and exposure system for on-machine inspection of a reticle containing the circuitry to be printed on the wafer. Two apertured optical detectors are aligned with identical portions of the projected image of the reticle and scanned across the image of the reticle. Any difference in the electrical response of the two optical detectors indicates dirt or a flaw in the reticle.

19 Claims, 9 Drawing Figures

ON MACHINE RETICLE INSPECTION DEVICE

BACKGROUND OF THE INVENTION

This invention relates to precision step-and-repeat alignment and exposure systems for projection printing of a pattern from a reticle onto a semiconductive wafer.

Step-and-repeat alignment and exposure systems are used to print a circuit pattern appearing on a reticle onto a semiconductive wafer having a photosensitive coating by repeatedly projecting an image of the reticle onto the wafer using an actinic light source. Since the image of the reticle will be used to generate each circuit on the semiconductive wafer, it is important that the reticle be free of dirt on the clear or transparent areas as well as free of defects or damage that would affect the projected circuit pattern. In the past, such reticles have usually been manually inspected by the system operator before they are placed in the system reticle holder. This procedure has the disadvantages that the operator may not notice dirt or damage that will cause the circuits to be defective, and dirt may appear or damage may be caused after inspection when the reticle is placed in the reticle holder.

There are also some inspection devices that are used to inspect the reticle before it is placed in the step-and-repeat alignment and exposure system. The reticle to be used is compared with a reference reticle known to be good by using two identical optical scanners to scan identical portions of the two reticles at the same time. If there is dirt or damage on one of the reticles, the output of one of the optical scanners will differ from that of the other and the location of the detected dirt or damage can be determined. The inspection device operator can then either clean, repair or replace the reticle, as necessary. One of the significant disadvantages of such inspection devices is that the reticle must be handled by the operator after it has been inspected so that it can be placed in the alignment and exposure system. This post-inspection handling can result in damage to or dirt on the reticle, thus defeating the purpose of the inspection. In addition, it requires an additional reticle as the reference reticle.

A system for on-machine inspection of a reticle has been proposed using a laser light scattering technique. This system has the disadvantage that it will detect dirt on both the clear and opaque areas of the reticle. Since dirt on the opaque areas will not affect the quality of the projected image, a "false alarm" will be given. In addition, this system will not detect defects or damage in the pattern on the reticle.

SUMMARY OF THE INVENTION

In accordance with the preferred embodiment of the present invention, a precision step-and-repeat alignment and exposure system for printing a circuit pattern on a semiconductive wafer is provided with a pair of apertured optical detectors on the main stage that supports the wafer. The system includes a reticle support for a reticle bearing the circuit pattern to be printed on the semiconductive wafer and an optical system for projecting an image of the reticle onto the wafer. The main stage can move the wafer so that multiple images of the reticle can be printed on the wafer.

Before a wafer is placed on the main stage, an image of the reticle is projected onto the apertured optical detectors, and each apertured optical detector is aligned with a separate but identical portion of the reticle. The main stage is then moved in such a manner as to scan the apertured optical detectors across the image of the reticle. Any dirt or flaw on one portion of the recticle that would affect the image to be printed onto the wafer will cause the electrical response of one apertured optical detector to differ from that of the other. This difference will be detected by electrical circuitry connected to the apertured optical detectors and will be suitably indicated or recorded to allow an operator to take appropriate corrective action.

Since the scanning of the apertured optical detectors can be done automatically, the present invention need not depend on the skill of an operator in spotting dirt or flaws and provide a more thorough inspection than can be achieved manually. By inspecting the projected image, only those dirt particles or flaws will be identified that would actually cause a problem in the printed image on the semiconductive wafer.

DESCRIPTION OF THE PREFERRED EMBODIMENT

Figure 1:
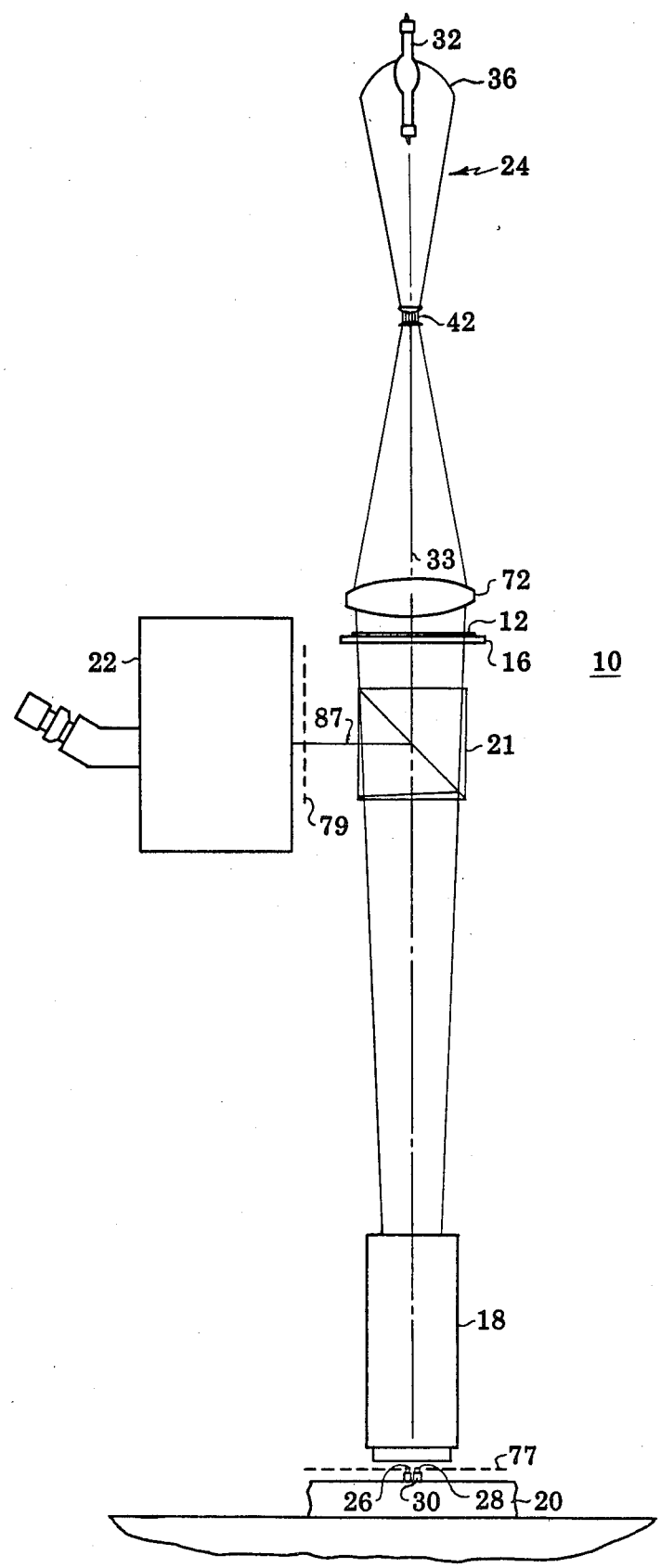
FIG. 1 is a schematic representation of the optical portion of a precision step-and-repeat alignment and exposure system.

FIG. 1 shows a precision step-and-repeat alignment and exposure system 10, such as the one shown and described in copending U.S. patent application Ser. No. 26,722 for an Improved Projection Alignment and Exposure System filed on Apr. 3, 1979, by Edward H. Phillips (subsequently abandoned in favor of continuation U.S. patent application Ser. No. 396,099 filed July 7, 1982), which application is assigned to the same assignee as the present application and is hereby incorporated by reference. Such a system repeatedly prints one level of microcircuitry, contained on a first object, such as a reticle 12, at an array of adjacent regions of a second object, such as a semiconductive wafer (not shown) on a main stage 20, in alignment with other levels of microcircuitry previously printed or yet to be printed at those same regions. Alignment and exposure system 10 includes a stage 16 for holding the reticle 12, a 10:1 projection lens 18 for projecting an image of illuminated portions of the reticle into the semiconductive wafter or other items on main stage 20 (the main stage being employed for positioning the semiconductive wafer or other items with respect to the projected image of the illuminated portions of the reticle), a beam splitter 21 and a compound split field microscope 22 for viewing aerial images of portions of the semiconductive wafer or other items illuminated by the projected image of the reticle, and a light source unit 24 for illuminating the reticle to allow viewing of those aerial images during alignment operations and to expose a photosensitive film on the semiconductive wafer during step-and-repeat printing operations.

Main stage 20 may comprise a stage that may be moved along orthongonal X and Y axes to any position in a horizontal plane by appropriate servo drive units as described in the referenced patent application. An apertured optical detector 26 is fixedly supported by main stage 20 and a second apertured optical detector 28 is removably mounted on a substage 30. Substage 30 is in turn adjustably mounted on main stage 20. The apertured optical detectors are described in greater detail below in connection with subsequent figures.

Light source unit 24 includes a mercury arc lamp 32 for emitting a spectrum of light energy including blue illuminating and exposure light having a wavelength of about 436 nanometers for both illuminating and exposing the photosensitive film on the semiconductive wafer (herein simply referred to as exposure light). Mercury arc lamp 32 is fixedly mounted along a vertically extending portion of an optical path 33 of alignment and exposure system 10. An elliptical reflector 36 surrounds mercury arc lamp 32 and is fixedly coaxially mounted therewith for projecting a beam of light emitted by the mercury arc lamp downward to a light integrator 42. Light integrator 42 is fixedly mounted in the vertically extending portion of optical path 33 and is employed for providing the beam of light passing therethrough with a uniform intensity distribution in the plane of reticle 12.

This downwardly directed light passes through a positive lens 72, reticle 12, and beam splitter 21 to projection lens 18. Positive lens 72 is fixedly mounted along optical path 33 so as to image light appearing at the output pupil of light integrator 42 at the input pupil of projection lens 18. As described in detail in the referenced patent application, an optical filter can be used to select the blue light from mercury arc lamp 32.

Beam splitter 21 is mounted in optical path 33 so as to pass eighty percent of the light passing through reticle 12 to projection lens 18, which is also mounted in optical path 33. Projection lens 18 focuses the light passing through reticle 12 at a first image plane 77 adjacent to main stage 20 and directly beneath the projection lens, thereby projecting images of illuminated portions of reticle 12 onto whatever object is positioned in that image plane directly beneath the projection lens. The portions of that object onto which those images are projected are therefore illuminated by the light passing through reticle 12. Twenty percent of the light reflected vertically upward from those portions of that object through projection lens 18 is reflected by beam splitter 21 along a horizontally extending portion of an optical path 87 to a second image plane 79 positioned the same optical distance from the beam splitter as is the reticle 12 and positioned between the beam splitter and compound split field microscope 22. Projection lens 18 focuses this reflected light at the second image plane 79 and thereby projects an aerial image of those portions of the object positioned in the first image plane 77 directly beneath the projection lens to the second image plane.

As described in detail in the referenced patent application, compound split field microscope 22 includes objective lenses and a binocular lens unit employed in precision alignment operations. The objective lenses can be moved with respect to the second image plane 79 as desired for viewing any portions of the aerial image projected to that plane.

Figure 2:
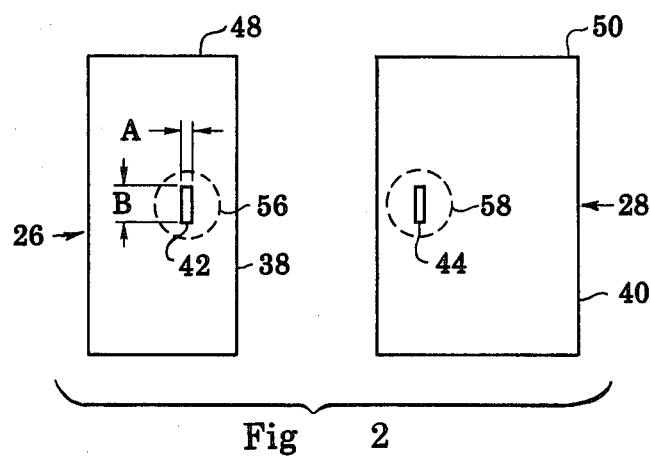
FIG. 2 is a plan view of two apertured optical detectors for a reticle inspection device according to the preferred embodiment of the present invention.

FIG. 2 shows a plan view of apertured optical detectors 26 and 28 that have masks 38 and 40 with windows 42 and 44, respectively. The dimensions of each window in the preferred embodiment are A equals 1 micron and B equals 10 microns. The masks are formed by sputtering a chrome layer 46 on sapphire substrates 48 and 50, as can be seen in FIG. 3, leaving rectangular openings in the chrome layer to define the windows.

Figure 3:
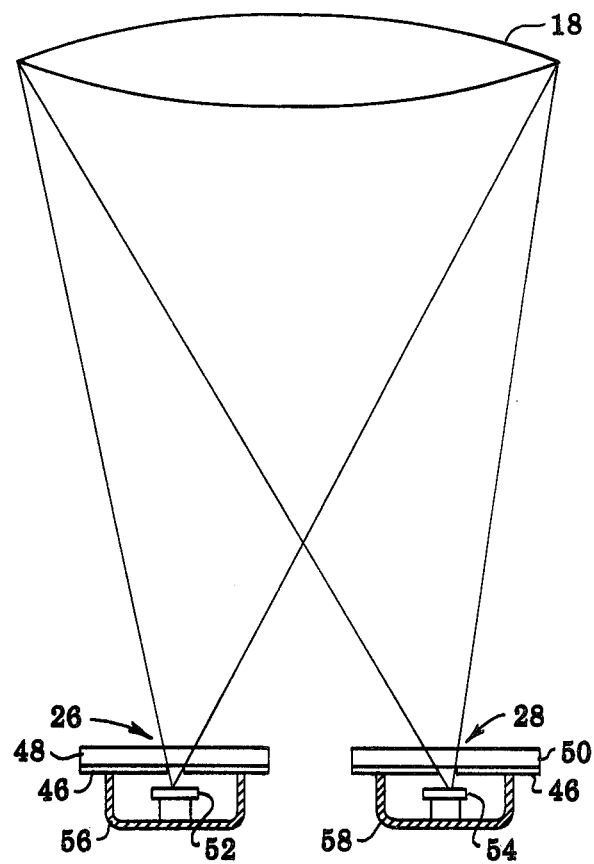
FIG. 3 is a schematic elevation of the device of FIG. 2.

With reference now to FIGS. 2 and 3, photodiodes 52 and 54 are supported behind windows 42 and 44, respectively, to receive the light passing through the windows and to produce an electrical response to the amount of light received. Each photodiode 52 or 54 is protected by a diode can 56 or 58 which is soldered to a gold border formed on the chrome layer on each of the sapphire substrates around the window 42 or 44. These diode cans are preferrably made of Kovar since it has a thermal coefficient of expansion very near that of sapphire. Photodiodes 52 and 54 together with masks 38 and 40 and their associated components described above comprise apertured optical detectors 26 and 28. As is illustrated in FIG. 3, light from different portions of reticle 12 passing through projection lens 18 strikes the two photodiodes through their respective windows.

Figure 4:
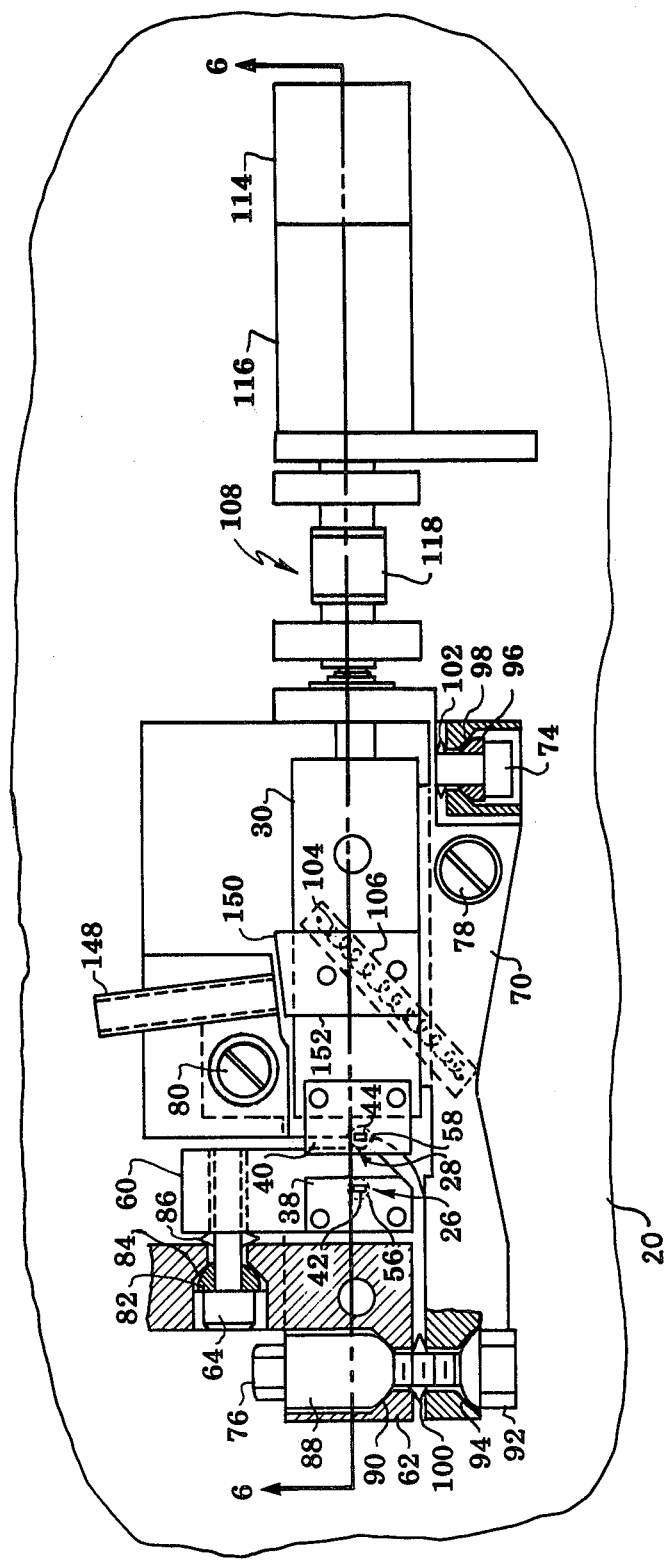
FIG. 4 is a plan view of a reticle inspection device according to the preferred embodiment of the present invention.
Figure 5:
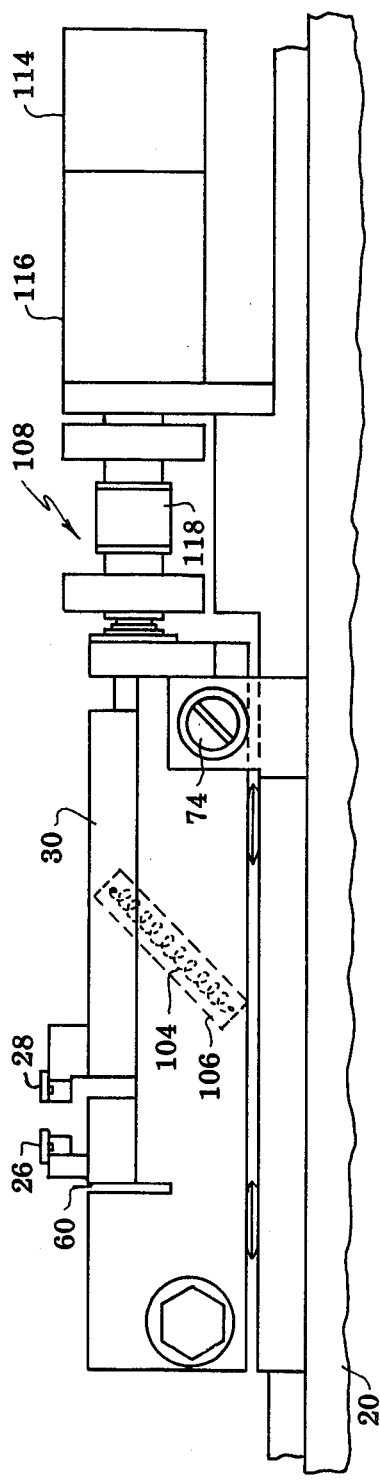
FIG. 5 is an elevation of the device shown in FIG. 4.
Figure 6:
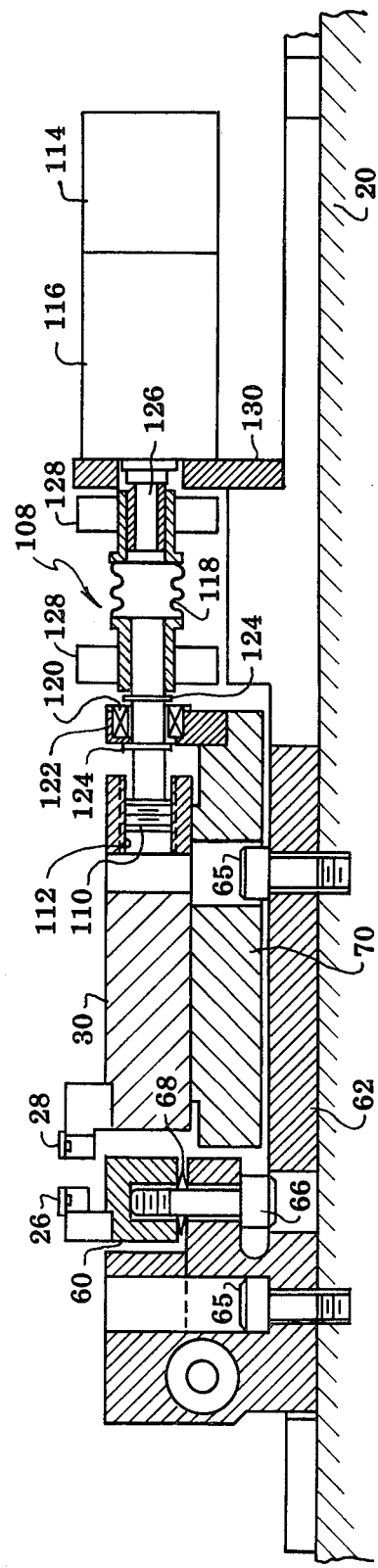
FIG. 6 is a cross-sectional view of the device shown in FIG. 5.

FIG. 4 shows a plan view of apertured optical detectors 26 and 28 mounted on main stage 20, and FIGS. 5 and 6 show elevational and sectional views thereof. Optical detector 26 is attached to a fixed support 60 which, in turn, is attached to a frame 62 by adjusting screws 64 and 66. Frame 62 is attached to main stage 20 with screws 65. The head of adjusting screw 64 bears against a hemispherical washer 82 that is seated in a conical seat 84 in frame 62. This adjusting screw is used to make window 42 in optical detector 26 parallel to window 44 in optical detector 28. Any slack in the threads of adjusting screw 64 is taken up by a back-to-back Belleville spring pair 86. Adjusting screw 66 holds support 60 against a back-to-back Belleville spring pair 68 and is used to adjust the height of optical detector 26 to the same height as optical detector 28 above main stage 20.

Optical detector 28 is attached to substage 30, which can be moved along one axis relative to fixed support 60. Substage 30 is supported by a base 70, and base 70 is attached to frame 62 by adjusting screws 74, 76, 78 and 80. Adjusting screws 78 and 80 are used to level base 70, thereby making the movement of substage 30 and the top surface of mask 40 perpendicular to optical path 33 (the Z axis) in FIG. 1. Adjusting screw 76 has an enlarged cylindrical portion 88 with a hemispherical end seated in a conical seat 90. This adjusting screw is threaded into base 70, and a lock nut 92 with a hemispherical end seated in a conically tapered seat 94 holds the adjusting screw rigidly in base 70. Likewise, adjusting screw 74 bears against a hemispherical washer 96 seated in a conical seat 98. Back-to-back Belleville spring pairs 100 and 102 are used to take up the slack in adjusting screws 76 and 74, respectively. Adjusting screw 76 is used to ensure that window 44 is centered on the same longitudinal axis or Y coordinate as window 42. Adjusting screw 76 also acts as a pivot for base 70 with respect to frame 62 about an axis defined by the center of the hemispherical end of cylindrical portion 88. Adjusting screw 74 is used to ensure that substage 30 moves along the Y coordinate about which the windows are centered (i.e., along an axis parallel to the longitudinal or X axis).

Substage 30 is mechanically biased against base 70 and toward fixed support 60 by a helical spring 104 in a channel 106. Substage 30 can be moved along the X axis by a substage drive 108. The substage drive comprises a lead screw 110 that engages a threaded bore 112 in substage 30. The lead screw is driven by a servo motor 114 through a speed reduction gear box 116 and a flexible coupling 118. The shaft of lead screw 110 is supported by a flanged ball bearing 120 mounted in a support 122 and has retaining rings 124 on either side of the ball bearing. The shaft of lead screw 110 and an output shaft 126 from speed reduction gear box 116 are attached to the flexible coupling 118 by clamps 128. The servomotor and the speed reduction gear box are attached to frame 62 by a motor support 130.

Figure 7:
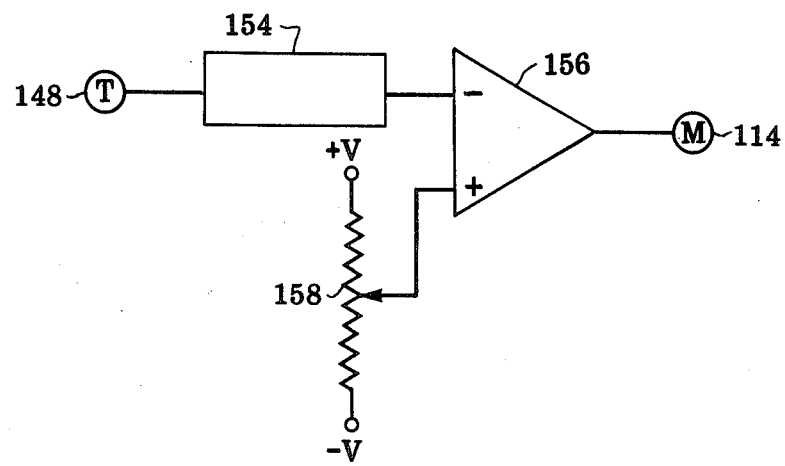
FIG. 7 is a schematic diagram of a servomotor control circuit.

Servomotor 114 is controlled by a control circuit (shown in FIG. 7) which is connected to a position transducer 148 (shown in FIG. 4). Position transducer 148 produces an output signal proportional to the separation between it and a sloped edge 150 of a plate 152 attached to substage 30. The position transducer 148 may be, for example, the position transducer of a Kaman Sciences Corporation position sensor model KD2300-.5SU, which also includes an oscillator-demodulator 154 (see FIG. 7). This position transducer will measure distances over a range of 0.5 millimeters, and by using an 8:1 slope on sloped edge 150, this range can be multiplied to 4.0 millimeters. As shown in FIG. 7, the output of oscillator-demodulator 154 of the control circuit is connected to an input of a servoamplifier 156 which, in turn, is connected to servomotor 114. The wiper of a potentiometer 158 is connected to another input of servoamplifier 156, and positive and negative voltage sources $+V$ and $-V$ are connected to the ends of potentiometer 158. Through this control circuit, the position of substage 30 is controlled by the setting of potentiometer 158.

Figure 8:
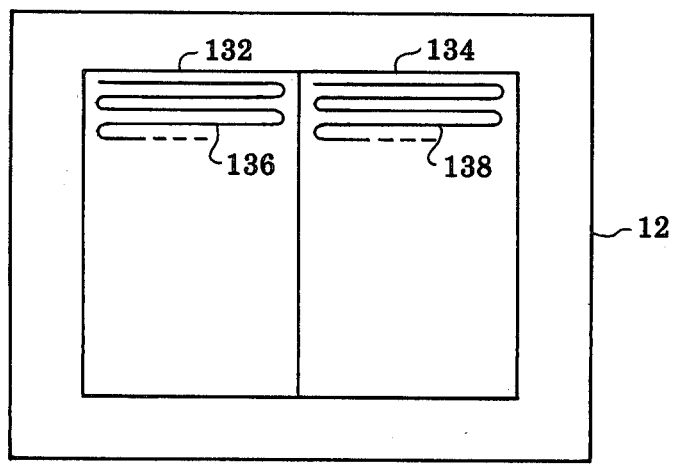
FIG. 8 is a schematic diagram illustrating the scanning operation of a reticle inspection device according to the preferred embodiment of the present invention.

The use of the apertured optical detectors to inspect a reticle is illustrated schematically in FIG. 8. The reticle must have at least two identical portions arranged side by side. Using split field compound microscope 22 the image of an element of the pattern in the upper left-hand corner of one portion 132 or 134 of reticle 12 is lined up with window 42. Then an identical image of the duplicate element in the upper left-hand corner of the other portion 132 or 134 of reticle 12 is lined up with window 44 using substage drive 108 to properly position window 44 along the X axis. When images of identical portions of reticle 12 are projected on windows 42 and 44, the electrical response of photodiodes 52 and 54 should be the same. By moving main state 20, images of successive identical portions of reticle 12 will be projected onto the apertured optical detectors. If the main stage is swept or moved back and forth along the X axis while being indexed along the Y axis with each successive sweep, the entire reticle can be inspected in a manner indicated by serpentine lines 136 and 138 in FIG. 8.

Figure 9:
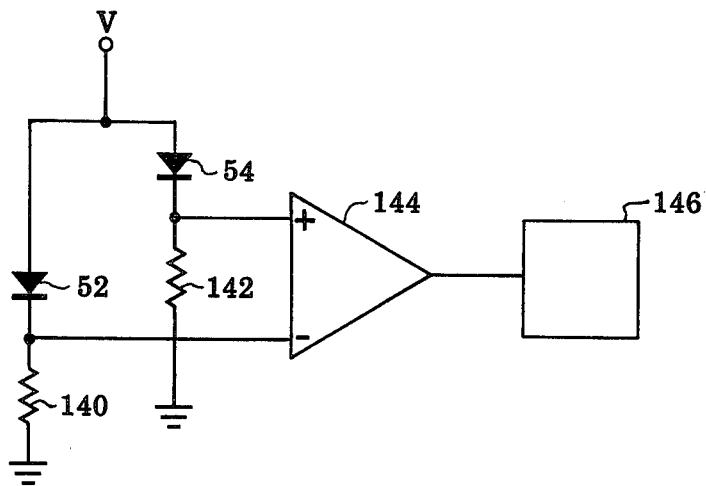
FIG. 9 is a schematic diagram of electrical circuitry for connection to apertured optical detectors.

If there is a piece of dirt on the reticle, the amount of light received by the apertured optical detector on which the dirty portion of the reticle is projected will differ from that received by the other one, and that difference will appear in the comparative electrical responses of the two photodiodes. The same will be true if a portion of the reticle is damaged. As shown in FIG. 9, a simple electrical circuit can be used to compare the electrical responses of the two photodiodes and give an indication or alarm when the electrical responses differ by more than a predeterminded amount. Photodiodes 52 and 54 are connected to a voltage source V and to resistors 140 and 142, respectively, which are also connected to the negative and positive inputs of a comparator 144. The output of comparator 144 is connected to an indicating device 146 to cause a signal or alarm to be produced for the operator of the precision alignment and exposure system when dirt or damage on the reticle is detected.

The indicating device, in conjunction with the control mechanism for main stage 20 can also be used to record the X-Y position at which each piece of dirt or damage is detected on the reticle so that an operator can go back and inspect those areas of the reticle using compound split field microscope 22 to determine whether the reticle needs to be cleaned, repaired or replaced. This allows the reticle to be scanned automatically, once the windows 42 and 44 have been aligned with identical portions of the reticle pattern by the operator.

We claim:

1. A projection alignment and exposure apparatus comprising:

means for holding a pattern bearing element;
   a source of light for illuminating the pattern bearing element;
   a moveable stage for holding a workpiece to be aligned with respect to the pattern bearing element;
   optical means for projecting an image of a pattern on the pattern bearing element onto the stage;
   a first apertured optical detector supported on the stage to detect a portion of the projected image of the pattern on the pattern bearing element;
   a second apertured optical detector supported on the stage in spaced relationship with the first apertured optical detector to detect another portion of the projected image of the pattern on the pattern bearing element; and
   means for indicating differences in the detected portions of the projected image of the pattern on the pattern bearing element as the stage is moved to scan the first and second apertured optical detectors across that projected image.

2. A projection alignment and exposure apparatus as in claim 1 further comprising microscope means for use in aligning the first and second apertured optical detectors with selected identical portions of the projected image of the pattern on the pattern bearing element.

3. A projection alignment and exposure apparatus as in claim 1 wherein the second apertured optical detector is supported on the stage in a moveable relationship with the first apertured optical detector.

4. A projection alignment and exposure apparatus as in claim 3 further comprising microscope means for use in aligning the first and second apertured optical detectors with selected identical portions of the projected image of the pattern on the pattern bearing element.

5. A projection alignment and exposure apparatus as in claim 3 further comprising substage means, supported by the stage, for supporting the second apertured optical detector and for moving it with respect to the first apertured optical detector.

6. A projection alignment and exposure apparatus as in claim 5 further comprising microscope means for use in aligning the first and second apertured optical detectors with selected identical portions of the projected image of the pattern on the pattern bearing element.

7. A projection alignment and exposure apparatus as in claim 1 further comprising:
a moveable substage for supporting the second apertured optical detector on the stage in spaced moveable relationship with respect to the first apertured optical detector;
alignment means for aligning the first apertured optical detector with respect to a first portion of the projected image of the pattern on the pattern bearing element; and
servo control means, responsive to position feedback information, for moving the substage to align the second apertured optical detector with respect to an identical second portion of the projected image of the pattern on the pattern bearing element.

8. A projection alignment and exposure apparatus as in claim 7 wherein:
the substage is moveable along a single axis and has an edge portion sloped with respect to that axis; and
the apparatus includes a position transducer, fixedly disposed adjacent to the sloped edge portion, for providing position feedback information indicative of the position of the substage to the servo control means.

9. A projection alignment and exposure apparatus as in claim 7 wherein each apertured optical detector comprises:
a photodiode; and
a layer of nontransparent material having a transparent window formed therein adjacent to the photodiode.

10. A projection alignment and exposure apparatus as in claim 7 further comprising:
first adjustable means for adjusting one of the first and second apertured optical detectors to position that apertured optical detector in a common plane with the other of the first and second apertured optical detectors;
second adjustable means for adjusting one of the first and second apertured optical detectors to position a longitudinal axis of that apertured optical detector parallel to a corresponding longitudinal axis of the other of the first and second apertured optical detectors;
third adjustable means for adjusting one of the first and second apertured optical detectors along a common axis with the other of the first and second apertured optical detectors; and
fourth adjustable means for constraining the substage and the second apertured optical detector to move only along the common axis.

11. A projection alignment and exposure apparatus as in claim 10 wherein:
the first and second adjustable means are disposed for adjusting the first apertured optical detector; and
the third adjustable means is disposed for adjusting the second apertured optical detector.

12. A projection alignment and exposure apparatus as in claim 7 wherein said alignment means includes a split field microscope.

13. A projection alignment and exposure apparatus as in claim 12 wherein said alignment means further includes servo control means for moving the stage.

14. A projection alignment and exposure apparatus as in claim 1 wherein each apertured optical detector comprises:
a photodiode; and
a layer of nontransparent material having a transparent window formed therein adjacent to the photodiode.

15. A projection alignment and exposure apparatus as in claim 1 wherein:
one of the first and second apertured optical detectors is moveably supported on the stage in spaced moveable relationship with respect to the other of the first and second apertured optical detectors; and
the apparatus includes first adjustable means for adjusting one of the first and second apertured optical detectors to position that apertured optical detector in a commom plane with the other of the first and second apertured optical detectors, second adjustable means for adjusting one of the first and second apertured optical detectors to position a longitudinal axis of that apertured optical detector parallel to a corresponding longitudinal axis of the other of the first and second apertured optical detectors, third adjustable means for adjusting one of the first and second apertured optical detectors along a common axis with the other of the first and second apertured optical detectors, and fourth adjustable means for constraining the moveable apertured optical detector to move only along the common axis.

16. A projection alignment and exposure apparatus as in claim 15 wherein:
the first apertured optical detector is stationary and the second apertured optical detector is moveably supported on the stage in spaced moveable relationship with respect to the first apertured optical detector;
the first and second adjustable means are disposed for adjusting the first apertured optical detector; and
the third and fourth adjustable means are disposed for adjusting and constraining the second apertured optical detector.

17. A projection alignment and exposure apparatus as in claim 1 further comprising alignment means for aligning the first apertured optical detector with respect to a first portion of the projected image of the pattern on the pattern bearing element and for aligning the second apertured optical detector with respect to a second identical portion of the projected image.

18. A projection alignment and exposure apparatus as in claim 17 wherein said alignment means includes a split field microscope.

19. A projection alignment and exposure apparatus as in claim 18 wherein said alignment means further includes:
servo control means for moving the stage; and
a servo controlled substage for supporting the second apertured optical detector on the stage in spaced moveable relationship with respect to the first apertured optical detector.

* * * * *